US006662326B1

(12) United States Patent
Schöber

(10) Patent No.: US 6,662,326 B1
(45) Date of Patent: Dec. 9, 2003

(54) CIRCUIT CELL HAVING A BUILT-IN SELF-TEST FUNCTION, AND TEST METHOD THEREFOR

(75) Inventor: Volker Schöber, München (DE)

(73) Assignee: Infineon Technologies AG, Munich (DE)

( * ) Notice: Subject to any disclaimer, the term of this patent is extended or adjusted under 35 U.S.C. 154(b) by 533 days.

(21) Appl. No.: 09/686,834

(22) Filed: Oct. 11, 2000

(30) Foreign Application Priority Data

Oct. 11, 1999 (DE) .......................................... 199 48 904

(51) Int. Cl.[7] .............................................. G01R 31/28
(52) U.S. Cl. ........................ 714/733; 714/738; 714/735
(58) Field of Search ................................. 714/738, 735, 714/733

(56) References Cited

U.S. PATENT DOCUMENTS

| 4,764,926 | A | * | 8/1988 | Knight et al. ................ 714/733 |
| 5,173,904 | A | | 12/1992 | Daniels et al. .............. 714/729 |
| 5,442,643 | A | | 8/1995 | Adachi ........................ 714/733 |
| 5,654,971 | A | * | 8/1997 | Heitele et al. ............... 714/735 |
| 6,006,350 | A | * | 12/1999 | Tsujii ......................... 714/738 |
| 6,223,312 | B1 | * | 4/2001 | Nozuyama .................. 714/724 |

OTHER PUBLICATIONS

Nicolici et al., Efficeint BIST ahrdware insertion with low test application time for synthesized data paths, 1999, School of Engineering and Advanced Technology, Staffordshire University, p. 1–7.*

Lubaszewski et al, ABILBO: analog built–in block observer, 1996, IEEE, p. 1–5.*

Thomas W. Williams et al.: "Design for Testability—A Survey", Proceedings of the IEEE, vol. 71, No. 1 Jan. 1983, pp. 98–112.

* cited by examiner

Primary Examiner—Albert Decady
Assistant Examiner—Shelly A Chase
(74) Attorney, Agent, or Firm—Laurence A. Greenberg; Werner H. Stemer; Ralph E. Locher

(57) ABSTRACT

The circuit cell for test methods having a built-in self-test function for modular circuits. The cell has a memory unit for storing data, a combinatorial logic circuit for data processing, and a memory control unit for controlling the memory unit. The memory control unit can be configured such that it sets the memory unit as a test pattern generator in a transmission mode and sets it as a test pattern compression device in a reception mode. The memory control unit produces a synchronizing signal for synchronizing the memory unit on the basis of communication signals which are interchanged by the memory control unit and memory control units in further circuit cells. With these methods, a transmission circuit cell is synchronized locally, so that a global clock signal is not required.

11 Claims, 3 Drawing Sheets

CIRCUIT CELL HAVING A BUILT-IN SELF-TEST FUNCTION, AND TEST METHOD THEREFOR

BACKGROUND OF THE INVENTION

Field of the Invention

The invention relates to a method for testing circuit cells which can be used for the modular design of a self-test circuit, and to circuit cells having a built-in self-test function. The test method can be used for circuits of modular design.

U.S. Pat. No. 5,422,643 describes a printed circuit board having a plurality of integrated circuits mounted thereon, and a method for testing the integrated circuits mounted on the printed circuit board. In this context, the integrated circuits each have a main circuit unit, test circuits, a latch circuit and a system interface which controls the data input and the data output for the test circuits. The main circuit unit carries out various functions, for example data processing operations. In terms of circuitry, the test circuits are of identical design to the main circuit unit and are connected to the latter and to the system interface by means of a bus in each case.

The paper "Design for Testability—A Survey" in Proceedings of the IEEE, volume 72, No. 1, January 1983, pages 96–112 describes the structure of a BILBO register and its various modes of operation for test pattern generation, signature analysis and test pattern evaluation, and also the operation of the BILBO register as a scan register. Deductive networks are tested using surrounding BILBO registers by operating BILBO registers upstream of the network which is to be tested as a test pattern generator and operating the downstream BILBO register as a signature analysis register.

After production, integrated circuits are subjected to a test method for testing the logic and dynamic responses in order, in the first instance, to detect faulty circuits and, in the second instance, to use the test results to check the performance of the integrated circuits. The integrated circuits comprise a multiplicity of logic components which, for their part, comprise circuit elements and transistors. Circuits with a high level of integration complexity have up to 100,000,000 circuit elements and transistors. In the case of prior art test methods, stimulation test patterns are applied to the integrated circuit by a test machine and response test patterns at the outputs of the integrated circuit are read out by the test machine and compared with a nominal response. The test response pattern output by the circuit which is to be examined (DUT: Device Under Test) needs to match the nominal test response for the integrated circuit to be detected as fault-free.

Integrated circuits are increasingly being designed with BIST structures (BIST: Built-in Self Test), i.e. the integrated circuit additionally implements logic which comprises test pattern generators and test data evaluation modules. In this case, the test machine supplies only one clock signal for the integrated circuit which is to be examined and, on the basis of the data read out from the test, data evaluation modules, determines whether or not the integrated circuit is faulty.

If a self-test function is integrated into the circuit, then the memory unit is replaced by a special memory unit which is able to generate test patterns and to compress test patterns. In this context, the memory unit in the circuit cell usually comprises a BILBO register (BILBO: Built-In Logic Block Observation). A BILBO register is a register which is independently able to generate test patterns and/or to compress test pattern data. A BILBO register generally has four operating states, namely a normal operating state as a register, an operating state for test pattern generation and test pattern transmission, an operating state for test data reception and test data compression and an operating state as a serial shift register for initialization and reading out/reading in test data.

FIG. 2 shows two interconnected circuit cells in detail during a test run.

The circuit SZ1 contains a deductive (combinatorial) circuit K1 for data processing, a memory unit S1 for storing data, for example a BILBO register, and a memory control unit SSE1 for controlling the memory unit S1. The second memory cell SZ2 contains a combinatorial circuit K2 for data processing, a memory unit S2 for storing data, for example a BILBO register, and a memory control unit SSE2 for controlling the memory unit S2. The memory control units SSE1 and SSE2 are respectively connected to the memory units S1, S2 via a plurality of control lines SL1 and SL2. The control lines SL1, SL2 respectively comprise essentially three control lines. The first control line is used to output a test pattern generation instruction from the memory control unit (SSE) to the associated memory unit S. The second control line is used to output a test pattern compression instruction from the memory control unit (SSF) to the memory unit S. The third control line supplies a synchronizing signal from the memory control unit (SSE) to the memory unit S.

In the test mode, a test machine TA controls the local memory control units SSE1, SSE2 in the circuit cells via control lines SL3, SL4 and outputs a synchronizing signal S to the memory control units SSE1 and SSE2 via synchronizing signal lines SSL1, SSL2. In the memory control units SSE1, SSE2, the synchronizing signal S is switched through to the associated memory unit S1, S2 for synchronization purposes.

A disadvantage of such a test method is that the multiplicity of memory control units SSE need to be connected to the test machine TA via a multiplicity of synchronizing signal lines SSL. The provision of such a clock system, which needs to be provided for test purposes on the integrated circuit which is to be tested, can be achieved only with a very high level of complexity on account of the signal delay time differences. By providing inverter chains having different delay times, the signal synchronizing lines SSL can be designed such that the delay times of the signals to the different memory control units SSE are compensated for. The additional inverter chains, for their part, form additional fault sources and result in a significantly higher power consumption for the integrated circuit.

Synchronous circuits are synchronized by a clock signal which is generated centrally. A synchronous clock signal can be distributed over an integrated circuit only with a very high level of complexity, on account of the signal delay times. In the prior art, this is done, by way of example, using inverter chains with different delay times and driver lines. For this reason, asynchronous circuits are increasingly being used. These can be produced using a modularized circuit design. At the lowest level, the asynchronous circuit of modular design comprises circuit cells which have a combinatorial circuit for data processing, a memory unit and a memory control unit in each case. The memory control units in the circuit cells are connected to the memory control units in further circuit cells via communication lines, and interchange request signals (Request) and reception acknowledgement signals (Acknowledge). Each circuit cell can be operated as a transmission circuit cell on the data output side or as a reception circuit cell on the data input side.

FIG. 1 shows a block diagram of an asynchronous circuit having three circuit cells which can each be connected as transmission or reception circuit cells. The circuit cells are connected to one another via data transmission request lines (R: Request) and data reception acknowledgement lines (A: Acknowledge). In addition, data are transmitted from a transmission circuit cell to a reception standard cell via data lines D for the purpose of further data processing.

SUMMARY OF THE INVENTION

The object of the invention is to provide a test method for circuit cells having a built-in self-test function which overcomes the above-noted deficiencies and disadvantages of the prior art devices and methods of this kind, and which enables testing to be carried out with a low level of circuit complexity and, in particular, there is no longer a need for a global clock system for transmitting synchronizing signals to the circuit cells.

With the above and other objects in view there is provided, in accordance with the invention, a method of testing circuit cells in an integrated circuit, wherein a respective circuit cell contains a combinatorial circuit for data processing, a memory unit, and a memory control unit, and wherein the circuit cells, a test pattern generation, and a test pattern evaluation are synchronized in decentralized fashion by the memory control units in the circuit cells. The method comprises the following steps:

initializing one circuit cell as a test pattern transmission circuit cell and initializing one circuit cell as a test pattern reception circuit cell;

transmitting an instruction signal from a memory control unit in the test pattern transmission circuit cell to the associated memory unit for generating a test pattern;

applying the test pattern to a combinatorial circuit for data processing by the memory unit in the test pattern transmission circuit cell;

transmitting a request signal by the memory control unit in the test pattern transmission circuit cell to the memory control unit in the test pattern reception circuit cell;

transmitting an instruction for test pattern compression to the memory unit in the test pattern reception circuit cell by the memory control unit in the reception circuit cell;

transmitting an acknowledgement signal from the memory control unit in the test pattern reception circuit cell to the memory control unit in the test pattern transmission circuit cell;

switching the memory unit in the test pattern reception circuit cell to a test data evaluation mode by the memory control unit in the test pattern reception circuit cell;

transmitting a request signal to the test machine for reading-out the compressed test data by the memory control unit in the test pattern reception circuit cell; and reading out the test data of the memory unit in the test pattern reception circuit cell by the test machine.

In other words, the invention provides a method for testing circuit cells which contain a combinatorial circuit for data processing, a memory unit and a memory control unit in each case, the circuit calls and the test pattern generation and/or test pattern evaluation being synchronized in decentralized fashion by the memory control units contained in the circuit cells. The method has the following steps:

the circuit cells are initialized as a test pattern transmission circuit cell and a test pattern reception circuit cell, an instruction signal is transmitted from the memory control unit in the test pattern transmission circuit cell to the associated memory unit in order to generate a test pattern, the generated test pattern is transmitted from the memory unit in the test pattern transmission circuit cell to the combinatorial circuit for data processing, a request. signal is transmitted from the memory control unit in the test pattern transmission circuit cell to the memory control unit in the test pattern reception circuit cell, an instruction is transmitted from the memory control unit in the test pattern reception circuit cell to the associated memory unit for test pattern compression, an acknowledgement signal is transmitted from the memory control unit in the test pattern reception circuit cell to the memory control unit in the rest pattern transmission circuit cell, the memory unit in the test pattern reception circuit cell is switched to the test data evaluation mode by the memory control unit in the test pattern reception circuit cell, a request signal is transmitted to the test machine in order for the test data to be read out by the memory control unit in the test pattern reception circuit cell, the test machine reads out the test data from the memory unit in the test pattern reception circuit cell.

In accordance with an added feature of the invention, the test data read out are compared with a nominal response for the test data.

In accordance with a preferred development of the method according to the invention, the memory unit in a standard cell is synchronized by a synchronizing signal which is generated, by the associated memory control unit on the basis of communication signals which are interchanged by the memory control unit and memory control units in further standard cells.

This affords the particular advantage that the method according to the invention also tests that the communication signal interchange is working.

In a further preferred embodiment of the method according to the invention, the memory control units in the various standard cells interchange data transmission request signals and data reception acknowledgement signals amongst one another as communication signals.

With the above and other objects in view there is also provided, in accordance with the invention, a circuit cell in an integrated circuit having a built-in self-test function for a circuit of modular configuration, comprising: a memory unit for storing data;

a combinatorial circuit for data processing connected to the memory unit;

a memory control unit connected to and controlling the memory unit;

the memory control unit being configurable to set the memory unit as a test pattern generator in a transmission mode and as a test pattern compression device in a reception mode; and the memory control unit generating a synchronizing signal for synchronizing the memory unit in dependence on communication signals interchanged by the memory control unit and memory control units in further circuit cells in the integrated circuit.

In other words, the memory control unit is configurable in test mode such that it sets the memory unit as a test pattern generator in a transmission mode and sets it as a test pattern compression device in a reception mode, and the memory control unit generates a synchronizing signal for is synchronizing the memory unit on the basis of communication signals which are interchanged by the memory control unit and memory control units in further circuit cells in the integrated circuit.

The memory control unit can preferably be connected to memory control units in further circuit cells via communication line pairs, each communication line pair having a data transmission request line and a data reception acknowledgement line.

In accordance with another feature of the invention, the memory control unit can be connected to a test machine via a communication line pair, the memory control unit being capable of being initialized by the test machine via an initialization line, and the memory control unit transmitting internal state data to the test machine via a state reporting line.

In accordance with a concomitant feature of the invention, the memory unit is a BILBO register.

Other features which are considered as characteristic for the invention are set forth in the appended claims.

Although the invention is illustrated and described herein as embodied in circuit cell having a built-in self-test function, and test method therefor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
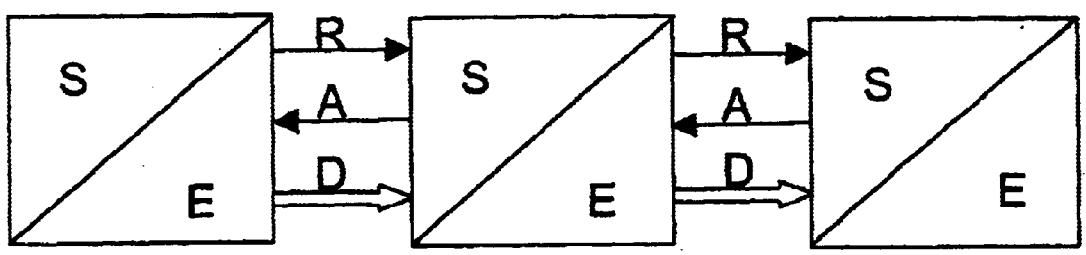
FIG. 1 is a block diagram of a circuit of modular design having a plurality of circuit cells in accordance with the prior art.
Figure 2:
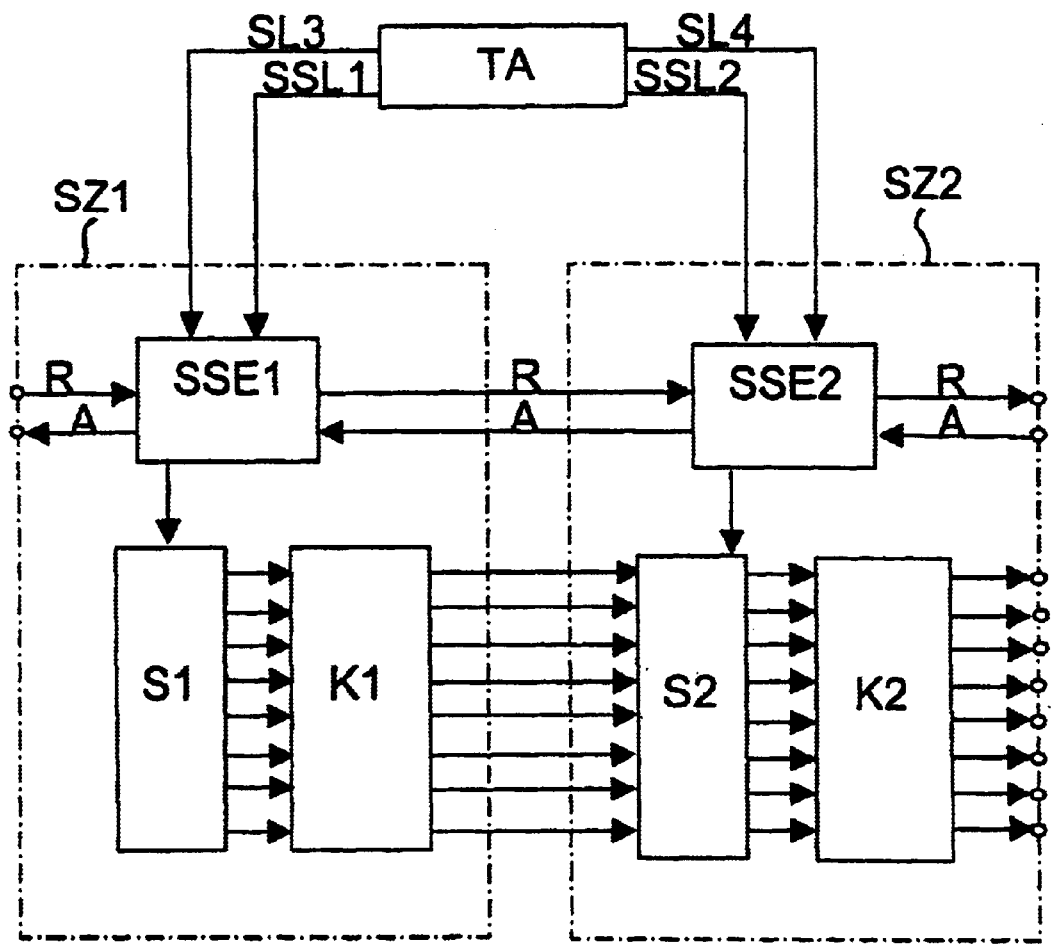
FIG. 2 is a schematic block diagram of two circuit cells which are tested by means of a conventional test method in accordance with the prior art.

Referring now to the figures of the drawing in detail the circuit cell 1 has a memory unit 2 for storing data, a combinatorial logic circuit 3 (deductive circuit) for data processing and a memory control unit 4 for controlling the memory unit 2.

Figure 3:
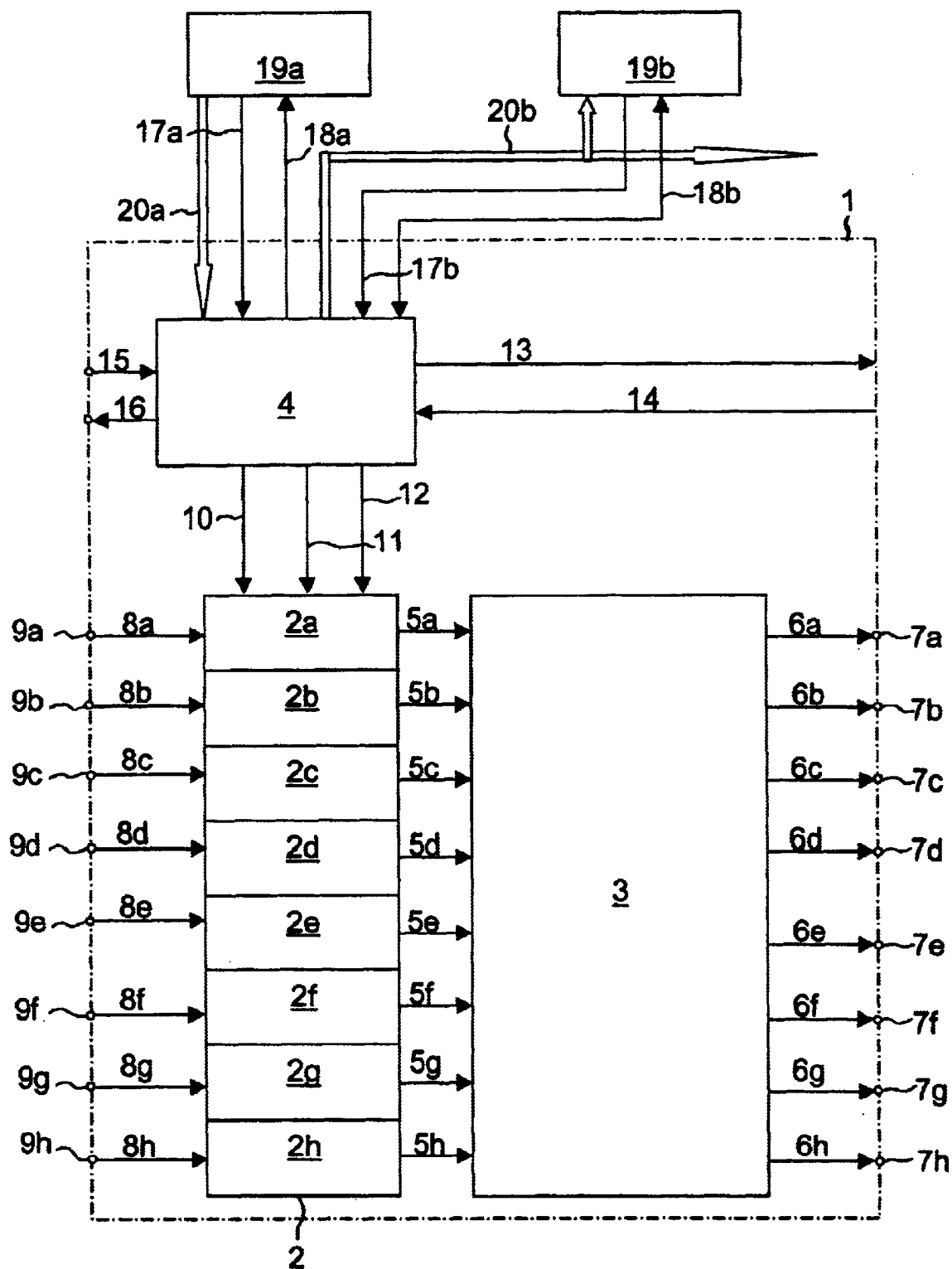
FIG. 3 is a schematic block diagram of a circuit cell having a built-in self-test function in accordance with the invention.

The memory unit 2 contains a plurality of memory cells 2a, 2b, 2c, 2d, 2e, 2f, 2g, 2h for buffering data. The memory unit 2 is preferably a BILBO register which can be operated in various modes of operation. It preferably has four modes of operation, the BILBO register functioning as a register or buffer in the normal mode, generating and transmitting test patterns in a second mode of operation, receiving and compressing test pattern data in a third mode of operation, and being initialized as a serial shift register through the reading-in of data, or outputting data for reading out test data, in a fourth mode of operation. The memory cells 2a–2h are each connected to the combinatorial circuit 3 via internal data lines 5a–5h. The combinatorial circuit 3 carries out data processing on the data which are present on the lines 5a–5h. The combinatorial circuit 3 is preferably a logic circuit comprising a multiplicity of gates. The combinatorial circuit 3 processes the data and outputs output data to output data connections 7a–7h via lines 6a–6h. The memory unit 2 is connected to data input connections 9a–9h via internal data lines 8a–8h. In the embodiment shown in FIG. 3, the number of output data connections 7a–7h of a circuit cell 1 according to the invention is equivalent to S the number of input connections 9a–9h of the circuit cell 1 according to the invention. This simplifies a systolic design using further circuit cells 1.

The circuit cells 1 may be situated so as to be distributed in an entire circuit such that an arbitrarily high number of data registers is provided between a transmission circuit cell and a reception circuit cell.

The memory unit 2 is controlled by the memory control unit 4 via control lines 10, 11 and receives a clock signal via a synchronizing line 12 in the test mode. The control lines 10, 11 are used to set the mode of operation of the memory unit 2. The control line 10 is used to transmit an instruction for test pattern generation TPG, and the control line 11 is used to transmit an instruction for test pattern compression TPC.

In one preferred embodiment, the four modes of operation of the BILBO register 2 are set in accordance with the table below.

| Mode of Operation | TPC | TPG |
|---|---|---|
| Normal Mode | 0 | 0 |
| Test Pattern Compression | 1 | 0 |
| Test Pattern Generation (shift register mode) | 0 | 1 |
| Initialization | 1 | 1 |

The memory control unit 4 transmits a synchronizing signal S via the Synchronizing line 12 to synchronize the memory unit 2 on the basis of communication signals which are interchanged between the memory control unit 4, and memory control units in further circuit cells. The memory control unit can be connected to memory control units in other circuit cells via communication line pairs 13, 14; 15, 16. Each communication line pair has a data transmission request line 13 for transmitting a request signal, and a data reception acknowledgement line 14 for receiving an acknowledgement signal. If the circuit cell 1 is configured as a test pattern reception circuit cell, the memory control unit 4 receives via the data transmission request line 15 a request signal for data transmission from a test pattern transmission circuit cell and transmits an acknowledgement signal back via the data reception acknowledgement line 16 to this test pattern transmission circuit cell after data transmission is complete.

If the circuit cell 1 is configured as a test pattern transmission circuit cell, it transmits a request signal via the data transmission request line 13 to a test pattern reception circuit cell connected downstream and receives a data reception acknowledgement signal from this test pattern reception circuit cell via the data reception acknowledgement line 14.

In the test mode, the memory control unit 4 can be connected to an external test machine 19a, 19b via communication line pairs 17a, 18a; 17b, 18b. In this context, the memory control unit 4 is initialized by the test machine 19a via an initialization line 17a and transmits internal state data to the test machine 19a via a state reporting line 18a during the test procedure. The test machine 19a has an initialization module. The test machine 19b evaluates, as evaluation unit, the test results. The test machines 19a, 19b are each connected to the memory control unit 4 via data lines 20a, 20b in the test mode.

The synchronizing signal S transmitted to the memory unit 2 via the synchronizing line 12 in order to 25 synchronize the memory unit during the test procedure is formed by the memory control unit 4 on the basis of the communication signals interchanged by further circuit cells via the communication signal lines 13, 14 and 15, 16. The synchronizing signal S is not generated in the test machines 19a, 19b, but rather independently in decentralized fashion in the memory control unit 4 in the circuit cell 1.

It is therefore not necessary to provide a clock line on the integrated circuit in order to supply a clock signal from the test machines 19 to the memory control unit 4 in a circuit cell 1. This means that the circuit complexity of the integrated circuit and also its power consumption can be significantly reduced. Furthermore, the functions of the memory control units 4 in the circuit cells 1 are also tested in the test procedure. In addition, the test procedure advantageously checks whether the communication between the memory control units 4 in the various circuit cells 1 via the communication lines 13, 14 and 15, 16 is working. The circuit cells 1 according to the invention also advantageously permit the operating speed of the memory control blocks 4 to be tested as well in the test procedure.

A further advantage is that the operability of the memory control unit 4 and of the combinatorial circuits 3 within the circuit cells 1 or the control and data path is tested together. To date, the memory control blocks 4 have been tested by means of separate test methods in the prior art.

Figure 4:
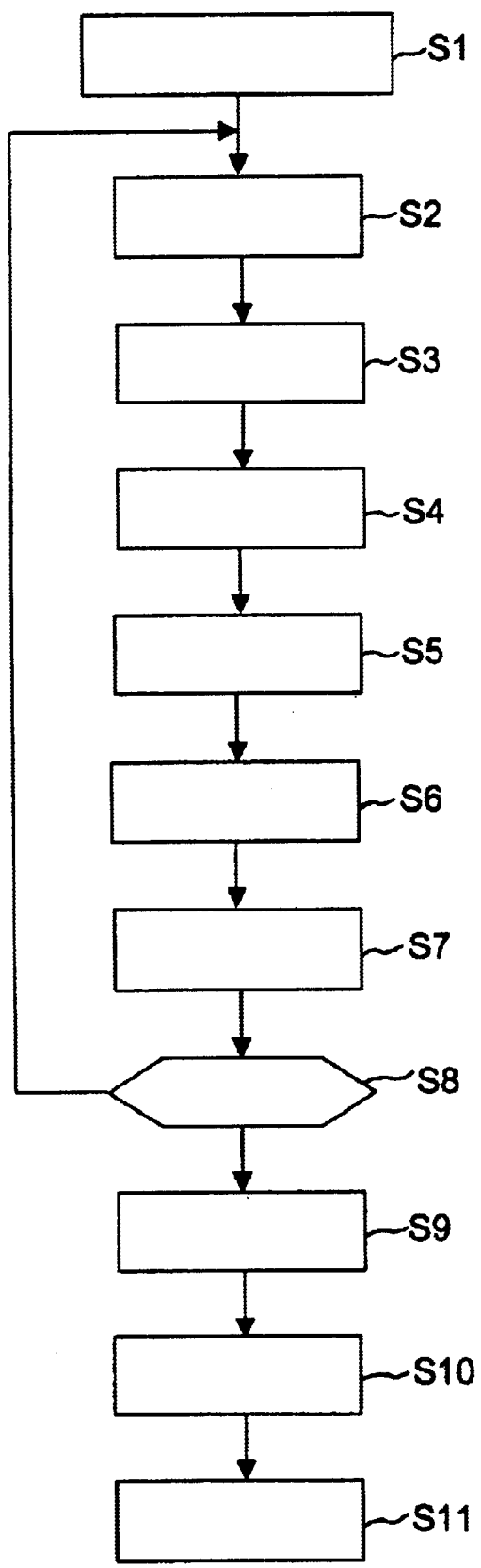
FIG. 4 is a flowchart outlining the novel method for testing circuit cells in accordance with the invention.

Referring now to FIG. 4, there is shown a flow chart of the inventive method for testing circuit cells having an integrated self-test function.

In step S1, the test machine 19a initializes a first standard cell 1 as a test pattern transmission circuit cell, and a second standard cell 1 as a test pattern reception circuit cell. At the same time, the associated memory control units 4 are initialized. The number of test pattern loops N is also defined in step S1. Initialization is effected by means of a serial test path or resetting of the registers.

In step S2, the local memory control unit 4 in the transmission circuit cell uses the control lines to issue the associated memory unit 2 with an instruction to generate a test pattern.

In step S3, the memory unit 2 applies the generated test pattern to the combinatorial circuit 3 via lines 5a–5h for the purpose of data processing. The combinatorial circuit 3 performs the test data processing and outputs a processed test data pattern via the output lines 6a–6h to the reception circuit cell 1 connected downstream.

In step S4, the memory control unit 4 in the transmission circuit cell transmits a request signal via the communication line 13 to a memory control unit 4 in the reception circuit cell connected downstream. Once the memory control unit 4 has received the request signal from the transmission circuit cell, it issues an instruction for test pattern compression to the associated memory unit 2 via the control lines in step S5.

In step S6, the memory control unit in the reception circuit cell transmits an acknowledgement signal to the transmission circuit cell.

In step S7, a counter n is incremented, or a check is carried out to determine whether the end of the test pattern generation has been reached.

In step S8, a check is carried out to determine whether the number N of test pattern loops set has been reached. If step S8 establishes that there are still further test loops to be run through, the procedure returns to step S2.

If the number of test loops has reached the value which was originally set, the procedure changes to step S9, in which the memory control unit 4 in the reception circuit cell switches the associated memory unit 2 to the test data evaluation mode.

The memory control unit 4 in the reception circuit cell then transmits to the test machine 19b in step S10 a request signal for reading out the test data compressed on the associated memory unit 2. In step S11, the test machine 19b transmits an acknowledgement or acknowledgement signal indicating that the test data has been received from the memory unit 2 in the reception circuit cell.

The test data read out are then compared with a nominal response for the test data, and it is established whether or not the circuit cells in the integrated circuit to be checked are faulty.

In the inventive method shown in FIG. 4, the test pattern transmission circuit cell and the test pattern reception circuit cell, the test pattern generation and/or test pattern evaluation are synchronized in decentralized fashion by the memory control units 4 contained in the circuit cells. The test machine 19a supplies only initialization instructions and no synchronizing signals to the memory control units 4. Inverter chains for compensating for delay time differences for the purpose of uniformly synchronizing the circuit cells present on the integrated circuit are not necessary in the case of the test method according to the invention. This means that the global synchronization network of the integrated circuit to be tested is no longer required and the power consumption of the latter is significantly reduced. Furthermore, the power supply lines and grounding lines of the integrated circuit can be significantly reduced, because the various circuit units in the circuit cells switch at different instants. This also significantly reduces the complexity of the integrated circuit overall. In addition, the test method according to the invention permits the performance of the integrated circuit to be reliably determined.

The test method according to the invention adapts itself to the speed increases as the circuit cools. The test modules having a local memory control unit 4 may also be tested by means of test methods which are synchronized using global control. In this context, a test machine produces the required test response which the test transmission circuit cell expects from the test reception circuit cell.

I claim:

1. A method of testing circuit cells in an integrated circuit, wherein a respective circuit cell contains a combinatorial circuit for data processing, a memory unit, and a memory control unit, and wherein the circuit cells, a test pattern generation, and a test pattern evaluation are synchronized in decentralized fashion by the memory control units in the circuit cells, the method which comprises the following steps:

initializing one circuit cell as a test pattern transmission circuit cell and initializing one circuit cell as a test pattern reception circuit cell;

transmitting an instruction signal from a memory control unit in the test pattern transmission circuit cell to the associated memory unit for generating a test pattern;

applying the test pattern to a combinatorial circuit for data processing by the memory unit in the test pattern transmission circuit cell;

transmitting a request signal by the memory control unit in the test pattern transmission circuit cell to the memory control unit in the test pattern reception circuit cell;

transmitting an instruction for test pattern compression to the memory unit in the test pattern reception circuit cell by the memory control unit in the reception circuit cell;

transmitting an acknowledgement signal from the memory control unit in the test pattern reception circuit cell to the memory control unit in the test pattern transmission circuit cell;

switching the memory unit in the test pattern reception circuit cell to a test data evaluation mode by the memory control unit in the test pattern reception circuit cell;

transmitting a request signal to the test machine for reading-out the compressed test data by the memory control unit in the test pattern reception circuit cell; and reading out the test data of the memory unit in the test pattern reception circuit cell by the test machine.

2. The method according to claim 1, which comprises comparing the test data read out with a nominal response for the test data.

3. The method according to claim 1, which comprises synchronizing the memory unit in the circuit cell with a synchronizing signal generated by the associated memory control unit based on communication signals interchanged by the memory control unit and memory control units in further standard cells.

4. The method according to claim 1, which comprises interchanging, with the memory control units in the various circuit cells, data transmission request signals and data reception acknowledgement signals among one another as communication signals.

5. The method according to claim 1, wherein the decentralized synchronization is effected with handshake signals.

6. A circuit cell in an integrated circuit having a built-in self-test function for a circuit of modular configuration, comprising:

a memory unit for storing data;

a combinatorial circuit for data processing connected to said memory unit;

a memory control unit connected to and controlling said memory unit;

said memory control unit being configurable to set said memory unit as a test pattern generator in a transmission mode and as a test pattern compression device in a reception mode; and said memory control unit generating a synchronizing signal for synchronizing said memory unit in dependence on communication signals interchanged by said memory control unit and memory control units in further circuit cells in the integrated circuit.

7. The circuit cell according to claim 6, which further comprises at least two communication line pairs each having a data transmission request line and a data reception acknowledgement line, whereby said memory control unit is connectible to memory control units in further circuit cells via sat at least two communication line pairs.

8. The circuit cell according to claim 6, which further comprises a communication line pair with an initialization line and a state reporting line connected between said memory control unit and a test machine, the test machine utilizing decentralized synchronizing signals to initialize said memory control unit via said initialization line, and said memory control unit transmitting internal state data to the test machine via said state reporting line.

9. The circuit cell according to claim 6, wherein said memory unit is a register configured to be switchable between the various modes of operation.

10. The circuit cell according to claim 9, wherein said register is configured to be switchable between a normal data storage mode, a mode as a serial shift register, a test compression mode, and an initialization mode.

11. The circuit cell according to claim 6, wherein said combinatorial circuit comprises a plurality of signal lines.

* * * * *